United States Patent [19]
Guch, Jr.

[11] Patent Number: 5,926,495
[45] Date of Patent: Jul. 20, 1999

[54] LASER DIODE PUMP WAVELENGTH SENSING AND CONTROL APPARATUS AND METHOD

[75] Inventor: Steve Guch, Jr., Longwood, Fla.

[73] Assignee: Litton Systems, Inc., Woodland Hills, Calif.

[21] Appl. No.: 08/905,705

[22] Filed: Aug. 4, 1997

Related U.S. Application Data

[51] Int. Cl.⁶ .................................................. H01S 3/0933
[52] U.S. Cl. .................................................. 372/75; 372/70
[58] Field of Search ................................. 372/29, 32, 33, 372/34, 38, 39, 55, 69, 70, 75

[56] References Cited

U.S. PATENT DOCUMENTS

| | | | |
|---|---|---|---|
| 4,446,556 | 5/1984 | Koepf | 372/4 |
| 4,821,273 | 4/1989 | Hori | 372/31 |
| 4,924,471 | 5/1990 | Clark et al. | 372/34 |
| 5,024,535 | 6/1991 | Winston, Jr. | 374/178 |
| 5,025,449 | 6/1991 | Yamamoto et al. | 372/32 |
| 5,042,042 | 8/1991 | Hori et al. | 372/32 |
| 5,168,503 | 12/1992 | Maeda | 372/22 |
| 5,265,115 | 11/1993 | Amano | 372/75 |
| 5,287,367 | 2/1994 | Yanagawa | 372/31 |
| 5,313,482 | 5/1994 | Zelenka et al. | 372/38 |
| 5,506,857 | 4/1996 | Meinzer | 372/55 |
| 5,684,590 | 11/1997 | Sanders et al. | 372/32 X |

*Primary Examiner*—John D. Lee
*Attorney, Agent, or Firm*—William M. Hobby, III

[57] ABSTRACT

A laser diode pumped laser has a laser diode wavelength sensing and control apparatus. A laser medium is mounted in a laser cavity and has a laser diode pump having a laser diode or laser diode array having an output of a predetermined wavelength for exciting the laser medium. An optical radiation detector is coupled to the output of the laser medium to receive and measure the radiation from the laser diode transmitted through the laser medium and a detector bias and signal measurement circuit is coupled to the optical radiation detector to receive signals therefrom and generate an output signal responsive to the optical radiation detector signals and to apply the generated signals to the laser diode power supply (or to diode heaters) to vary the power supply output to vary the laser diode wavelength to maintain the laser diode wavelength at the absorption peak of the laser medium. A method of sensing and controlling the laser diode pump wavelength for a laser includes selecting a laser in accordance with the apparatus and coupling the selected detector bias and signal measurement circuit to the optical radiation detector to receive signals therefrom and generate output signals responsive to the optical radiation detector signals and coupling the radiation bias in the signalling measuring circuit to the laser diode power supply to vary the diode power supply output to vary the laser diode wavelength to maintain the output near the absorption peak of the laser medium.

19 Claims, 1 Drawing Sheet

LASER DIODE PUMP WAVELENGTH SENSING AND CONTROL APPARATUS AND METHOD

BACKGROUND OF THE INVENTION

The present invention relates to a laser apparatus and method and especially to a solid state laser having a laser diode pump which senses and controls the output wavelength of the laser diode for the absorption peak of the laser medium.

Diode lasers and diode laser arrays exploit changes in temperature as a way to vary the output wavelength with temperature. For example, the output wavelength changes approximately 0.2 nanometers per degree Centigrade for AlGaAs devices. For applications using diode lasers or arrays to excite other lasers, such as Nd:YAG, it is important to match the diode laser output to a spectral absorption feature of the laser being pumped. This is needed in most cases to optimize optical power transfer between the pump diodes and the pumped laser. In other cases, it may be desired to ensure operation at an offpeak spectral feature to provide more spatially uniform optical excitation of the laser medium being pumped or to provide controlled transmission for use of the residual light in other processes, such as frequency mixing.

In the past, the sensing and control of the output wavelength of laser diodes and arrays has been done by measuring the temperature of the heat sink or mounting brackets of the laser diodes. By monitoring this temperature as an indirect measurand, it is assumed that the output wavelength is established. A weakness of this technique is that the temperature of the laser diodes may differ significantly from the sensor mounted in the heat sink or bracket. This may occur in cases where the physical separation is considerable, where the diodes are operating at high average power, or where the cooling geometry is complex. In such cases, the use of heat sink or bracket temperature to characterize the output wavelength will lead to inaccurate measurements of diode temperature. Where diode pumping is used to excite a crystal medium, such as Nd:YAG, errors in diode laser or array temperature measurement can lead to inefficient energy transfer. For example, a 5° Centigrade error will produce a wavelength error of over 1 nanometer as compared to a Nd:YAG absorption linewidth of only 0.7 nanometers. The result of such an error is likely to be a significant reduction in laser efficiency.

Another disadvantage of prior art in laser diode temperature control is the expense and complexity of implementation of temperature control. Accurate sensing requires a precision sensor and readout circuit, with extreme care in design needed to ensure that the sensor is mounted close to the laser diode being sensed and controlled. This is often mechanically difficult and requires extra design engineering and fabrication.

In the past, there have been a great many patents dealing with controlling the output of laser diodes in the telecommunications and recording industries. These prior art laser diode control circuits are used for direct beam stabilization rather than the diode pumping of a solid state laser and results in a more complex circuit. Prior art laser diode controls are usually oriented towards thermoelectrically heated or cooled diodes rather than high temperature diodes. High temperature diodes, in contrast to the thermoelectrically heated/cooled diodes, use only simple heaters connected to a heat sink to provide temperature control. Prior art laser diode controls used to affect output wavelength generally use filters, prisms and the like for wavelength detection, which elements are themselves temperature sensitive and not directly linked to the function or absorption of the pump diode output which produces optimal solid state laser output to be optimized by diode control.

Prior U.S. patents which control laser diodes can been seen in the Hori U.S. Pat. No. 4,821,273, and in the Hori et al. U.S. Pat. No. 5,042,042, both for a wavelength and output power stabilizing apparatus for a semi-conductor laser. These patents use two optical elements with differing spectral characteristics to sense wavelength, changes in the diode laser output, and to provide feedback to control diode temperature and the output wavelength. A control signal is provided to control output power levels. The Hori patents deal with control of the output wavelength of a laser diode and uses optical means to sense wavelength changes. The use of dual channels which must be stable over time to provide long term absolute stability of the diode laser adds complexity and demands that the channels have the same spectral performance over temperature to avoid long term wavelength output drifts. These patents use two distinct interference filters to sense the wavelength changes. The Amano U.S. Pat. No. 5,265,115, is for a solid state laser device having a feedback loop. A detector sensing the output power of a solid state laser provides feedback to increase pump power if output sags, thus stabilizing the output power. This patent deals with a diode laser used to pump a solid state laser but does not control the diode wavelength. Under some conditions, such as where the laser output power is dropping because the diode is too hot and its output spectrum does not match well, the absorption spectrum of the laser medium control scheme may worsen the problem. This patent attempts to invoke solid state laser control by brute force control of input pumping power rather than through control of the pump laser diode wavelength.

The Clark et al. U.S. Pat. No. 4,924,471 is a method for increasing the output power of a laser diode. A cooler is used to reduce the temperature of a GaInP laser diode to increase the output power. It deals with controlling the diode laser temperature but the temperature control is used to optimize power not to stabilize the wavelength. The Winston, Jr. U.S. Pat. No. 5,024,535, is a semi-conductor light source temperature measurement device. A semi-conductor temperature sensor is grown onto the structure of a laser diode and is used to control the diode temperature that hits the output wavelength. The control of the wavelength is indirect because it is entirely thermal and does not provide correction for wavelength changes of a diode as it ages. The Yanagawa U.S. Pat. No. 5,287,367, is an apparatus for controlling a semi-conductor laser in which the diode output spectrum is controlled by thermal control of an element adjacent to the semi-conductor laser and is for control of the wavelength to prevent beam alignment shifts in a CD system as opposed to ensuring that diode output matches solid state laser absorption. The laser wavelength is sensed by using a half mirror or filters, gratings, or a prism and two distinct channels are used to sense wavelength shifts rather than in the present invention which uses a single detector channel and absorbing material with a spectral profile and transmission to which the diode laser is to be logged. The Zelenka et al. U.S. Pat. No. 5,313,482, is a method and circuit arrangement for correcting the light power output of a laser diode. Electrical controls are used in conjunction with a power output detector to stabilize and control the output power level of a laser diode against changes over the diode's life. The Maeda U.S. Pat. No. 5,168,503, is a harmonic generator in which a drive current is modulated by a current modulator and the modulated drive current is supplied to a laser beam generator so that the laser beam emitted by the laser beam generator is varied in wavelength.

In contrast to these prior patents, the present invention is a laser diode/diode array temperature sensing and control system using optical transmission to generate the diagnostic signal. The temperature of a laser diode is sensed by measuring the optical transmission of a material with an absorption peak located within the spectral range of laser emission by using changes in transmission. As the laser temperature varies, the heat input to the laser may be varied to control the output wavelength accurately to remain coincident with the absorption peak.

SUMMARY OF THE INVENTION

A laser diode pumped solid state laser has a laser diode wavelength sensing and control apparatus. A laser medium is mounted in a laser cavity and has a laser diode pump having a laser diode or laser diode array having an output of a predetermined wavelength for exciting the laser medium. An optical radiation detector is coupled to the output of the laser medium to receive and measure the radiation from the laser diode transmitted through the laser medium. A detector bias and signal measurement circuit is coupled to the optical radiation detector to receive signals therefrom and generate an output signal responsive to the optical radiation detector signals and to apply the generated signals to the laser diode power supply (or to diode heaters or coolers) to vary the power supply output (or input to the diode heaters or coolers) to vary the laser diode wavelength to maintain the laser diode wavelength at the absorption peak of the laser medium. The closed-loop electro-optical system thus described ensures that the diode laser or array output is matched to the absorption of the solid state laser medium by minimizing its transmittance of pump radiation.

BRIEF DESCRIPTION OF THE DRAWINGS

Other objects, features, and advantages of the present invention will be apparent from the written description and the drawings in which.

DESCRIPTION OF THE PREFERRED EMBODIMENT

Figure 1:
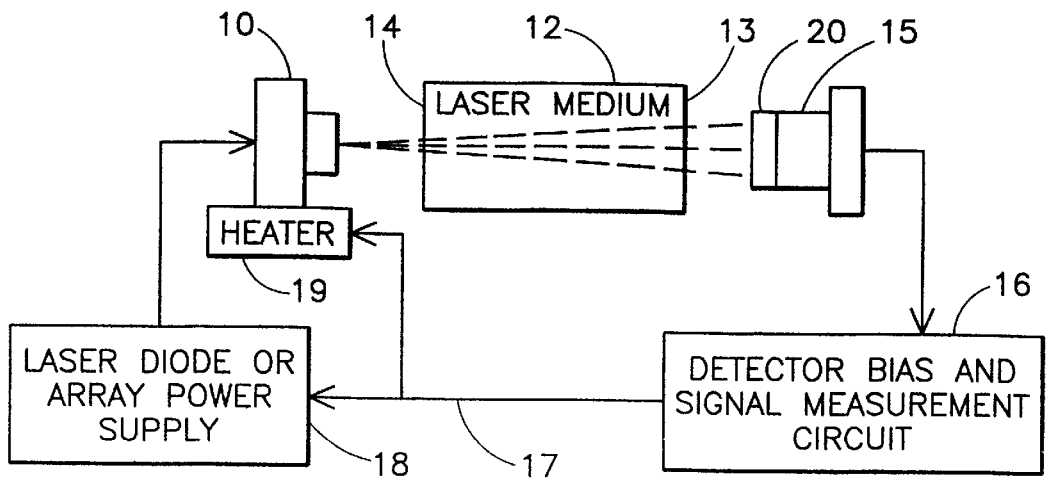
FIG. 1 is a block diagram of a preferred embodiment of the present invention.

Referring to FIG. 1, a laser diode or laser diode array 10 has an output 11 for pumping a laser medium 12. The laser diode output 11 has an output wavelength which is to be sensed or controlled. It is located so that all or a part of the output 11 is transmitted onto or through the laser medium 12. The wavelength of the output 11 is chosen to have an absorption peak for the laser medium 12. The laser medium 12 is positioned in a laser cavity which may be formed with mirrored or partially mirrored surfaces 13 and 14 directly on the laser medium 12 but can be located separate from the laser medium as desired. An optical detector 15 is positioned to observe some or all transmitted light radiation from the laser diode 10 through the laser medium 12 in order to sense variations in the transmission or output wavelength in the output 11 due to temperature changes in the laser diode 10. A feedback loop is implemented by the output of the optical radiation detector 15 being coupled to the detector bias and signal circuit 16 which has an output 17 coupled to the laser diode power supply 18 to increase or decrease the heat input to the diode laser 10 to maintain its output wavelength 11 at the desired position at the peak of the absorption of the laser medium 12. The laser diode 10 is used to pump the laser medium 12 and may be a pulsed pump AIGaAs diode array used to end pump a laser medium of Nd:YAG. The diode 10 is designed to operate at 60 degrees Centigrade to pump an 806 nanometer absorption peak of Nd:YAG. The optical radiation detector 15 can be an Si pin detector that is located at the opposite end of the Nd:YAG laser medium 12 and outside the laser resonator. As the laser diode 10 temperature varies slightly from optimum transmission through the Nd:YAG medium increases since the wavelength 11 is no longer at the peak of the absorption feature of the laser medium 12. As the signal output from the detector increases, it is converted from the analog signal received on the optical detector 15 and converted to a digital format and processed by the detector bias and signal measurement circuit 16. When the processor 16 detects increasing transmission of the diode pumping beams 11 through the laser medium, it commands an increase or decrease in power to the diode 10 to restore the desire optimum wavelength. The diode 10 can also be heated with a heater 19 mounted adjacent the diode heat sink for controlling the diode temperature.

Figure 2:
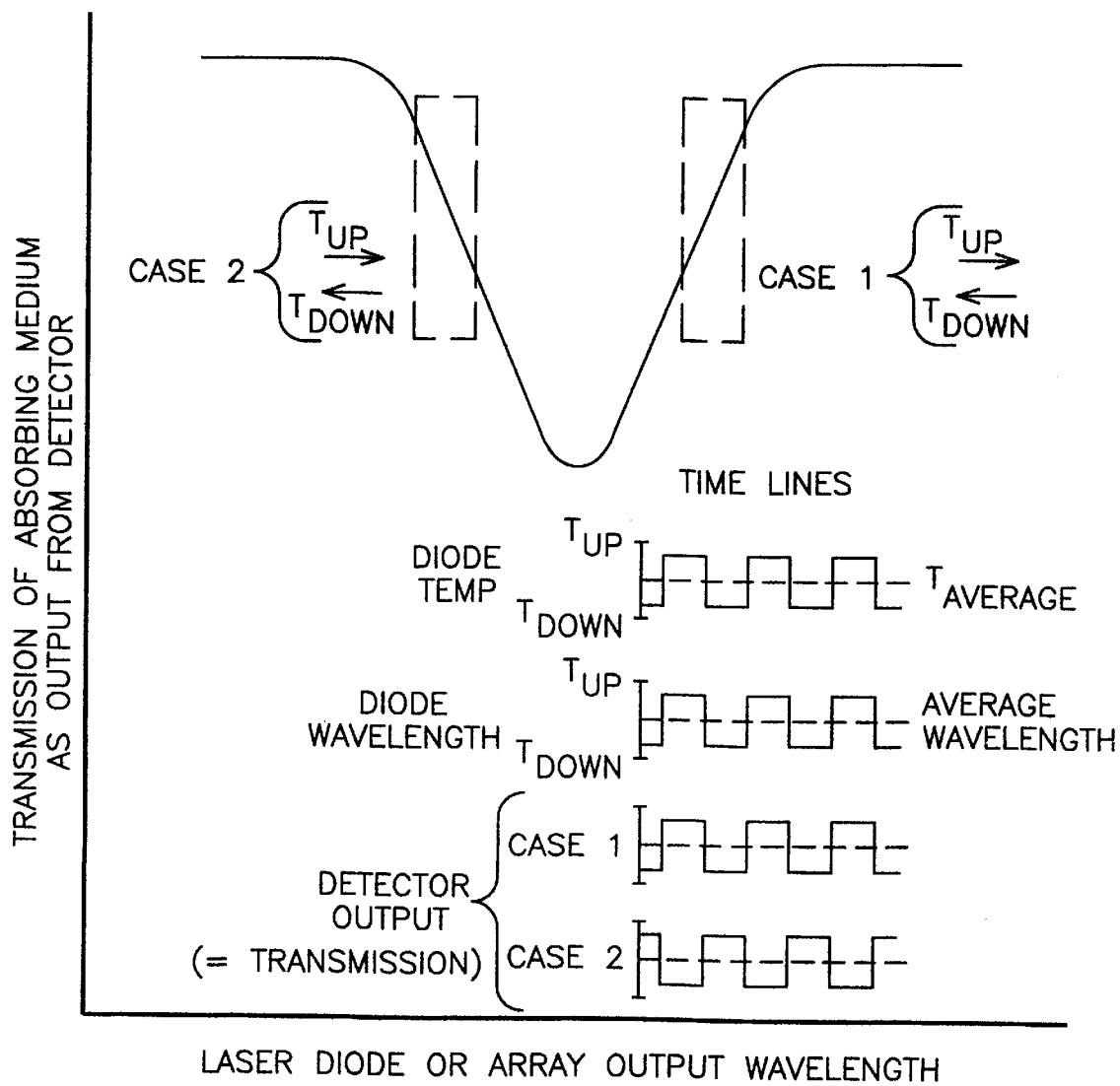
FIG. 2 is a graph illustrating the use of temperature dither in the circuit of FIG. 1.

For pulsed laser operation, the electric power input to the diode 10 can control the heat input to the diode 10 during the desired interpulse period ensuring that the electrical input is below the threshold of which laser radiation is emitted by the diode array. As the diode array drifts away from the desired Nd:YAG absorption peak, it is necessary to determine whether the heat input must be increased or reduced to match the emission and absorption peak. This is done by introducing a very small constant dither into the heat input and integrating the results. This allows observation of very small changes in transmission and providing the required control input, as illustrated in FIG. 2. As an example, it may be appropriate to vary the total electrical drive power through the use of a subthreshold interpulse method by 0.5% every 0.1 second. Because the diode arrays 10 responds very quickly in wavelength to temperature changes, the wavelength of the output 11 will change every 0.1 second in response to the changed thermal input. If the wavelength is longer than the absorption peak, the photodetector 15 output corresponding to the 0.1 second period when the diode heat input is increased, will be reduced very slightly over the period when the diode heat input is at the 0.5 lower value. By integrating over a number of pulses, the system builds up a measurable signal indicating that increased power input is driving the laser away from the desired peak position and that a gross change in heat input is needed to restore proper operation. Because the heat input and resultant transmission changes during the dither process are designed to be very small they produce perturbation of the output wavelength relative to the desired absorption feature. A system controller 16 then initiates corrective action to produce larger, microscopically observable changes to the heat input to the diode array.

Alternatively, a filter can be included in the optical detector 15 for detecting the fluorescence from the solid state laser medium 12 rather than measuring the transmitted light radiation from the laser diode 10. The control circuit 16 can then be set to measure the fluorescence emission for determining peak emission and then to control the diode temperature to maximize the fluorescence from the laser medium. This embodiment would work in the same manner as before except for the added or different filter to isolate the fluorescence from the laser medium for determining peak output as an indication of the absorption peak of the laser medium to thereby vary the temperature of the pumping laser diodes 10 to vary the wavelength.

FIG. 2 illustrates the use of the temperature dither in temperature sensing and control with the graph of transmission of the absorbing media is output from the detector along the Y axis and a laser diode or array output wavelength along the X axis. The arrows indicated show how the wavelength of the diode changed due to dither in temperature. From the figure it is clear that the phase of the detector output relative to the dither unambiguously determines whether heating or cooling is needed to bring the diode wavelength to the transmission minimum. The magnitudes of the changes in the graph are exaggerated for illustration purposes.

For true continuous-wave pumping, the temperature dither must be applied during active pumping. This slightly complicates the control algorithm requiring the correction of the detector output to reflect diode laser amplitude variations with the dither current.

It should be clear at this time that a laser diode pump laser has been provided in which the laser diode pump wavelength is accurately maintained at or near the absorption peak wavelength of the laser medium. The method of sensing and controlling of a laser diode pump wavelength of the laser includes selecting a laser having a laser medium mounted in a laser cavity and a laser diode pump having at least one laser diode having a pumping output of a predetermined wavelength for exciting the laser medium. A light radiation detector is selected to detect radiation having the laser diode output wavelength and coupled to the output of the laser medium to receive and measure radiation from the laser diode transmitted through the laser medium. A controller circuit is selected which converts a detected analog signal to a digital signal to determine the detected bias and signal measurement and is coupled to deliver an output signal to the laser diode power supply to vary the diode power supply output to vary the laser diode wavelength to maintain the wavelength near the absorption peak of the laser medium. The laser diode wavelength is varied by either varying the temperature of the laser diode array or by varying the pulsing of the laser diode power supply.

However, the present invention should not be construed as limited to the forms shown which are to be considered illustrative rather than restrictive.

I claim:

1. A laser having a laser diode pump wavelength sensing and control apparatus comprising:
    a laser medium mounted in a laser cavity;
    a laser diode pump for pumping said laser medium and having a laser diode and a diode power supply;
    an optical radiation detector coupled to the output of said laser medium to receive and measure radiation from said laser diode transmitted through said laser medium; and
    a detector bias and signal measurement circuit coupled to said optical radiation detector to receive signals therefrom and generate output signals responsive to the optical radiation detector signals, said detector bias and signal measurement circuit having an output coupled to said laser diode power supply to vary the diode power supply output to thereby vary said laser diode wavelength whereby the output wavelength of said laser diode is maintained near the absorption peak of said laser medium.

2. A laser having a laser diode pump wavelength sensing and control apparatus in accordance with claim 1 including a filter for filtering laser medium fluorescence output from said laser medium and said optical radiation detector being coupled to said laser diode for controlling the wavelength of said laser diode to maximize fluorescence output.

3. A laser having a laser diode pump wavelength sensing and control apparatus in accordance with claim 1 in which said laser diode pump has a plurality of laser diodes.

4. A laser having a laser diode pump wavelength control apparatus in accordance with claim 1 in which said laser diode pump has a diode array.

5. A laser having a laser diode pump wavelength sensing and control apparatus in accordance with claim 1 in which said optical radiation detector measures the radiation received in the laser diode wavelength from the output of said laser medium.

6. A laser having a laser diode pump wavelength sensing and control apparatus in accordance with claim 5 in which said detector bias and signal measurement circuit varies the electric power applied to said diode power supply to change the diode output wavelength.

7. A laser having a laser diode pump wavelength sensing and control apparatus in accordance with claim 5 in which said detector bias and signal measurement circuit varies the temperature of said laser diode to change the diode output wavelength.

8. A laser having a laser diode pump wavelength sensing and control apparatus in accordance with claim 5 in which said optical radiation detector includes a filter which passes the wavelength of the radiation output of said laser diode and blocks other wavelengths to thereby distinguish transmission of laser diode radiation through said laser medium.

9. A laser having a laser diode pump wavelength sensing and control apparatus in accordance with claim 8 in which said laser medium is Nd:YAG.

10. A laser having a laser diode pump wavelength sensing and control apparatus in accordance with claim 9 in which said laser diode pump includes a pulse pumped AlGaAs laser diode array.

11. A laser diode pump wavelength sensing and control method for a laser comprising the steps of:
    selecting a laser having a laser medium mounted in a laser cavity and a laser diode pump having a laser diode and a diode power supply and having a pumping output of a predetermined wavelength for exciting said laser medium;
    selecting an optical radiation detector selected to detect radiation having the laser diode output wavelength and being coupled to the output of said laser medium to receive and measure radiation from said laser diode transmitted through said laser medium;
    selecting a detector bias and signal measurement circuit;
    coupling said detector bias and signal measurement circuit to said optical radiation detector to receive signals therefrom and generate output signals responsive to the optical radiation detector signals:
    coupling said detector bias and signal measurement circuit having an output coupled to said diode power supply to vary the diode power supply output to thereby vary said laser diode wavelength whereby the output wavelength of said laser diode is maintained near the absorption peak of said laser medium.

12. A laser diode pump wavelength sensing and control method for a laser in accordance with claim 11 including selecting an optical radiation detector filter which passes the wavelength of the radiation output of said laser diode and blocks other wavelengths to thereby distinguish transmission of laser diode radiation through said laser medium.

13. A laser diode pump wavelength sensing and control method for a laser in accordance with claim 11 in which said step of selecting a laser diode pump includes selecting a laser diode pump having a plurality of laser diodes.

14. A laser diode pump wavelength sensing and control method for a laser in accordance with claim 11 in which said step of selecting a laser diode pump includes selecting a laser diode pump having a laser diode array.

15. A laser diode pump wavelength sensing and control method for a laser in accordance with claim 11 including measuring the radiation received in the laser diode wavelength from the output of said laser medium with said optical radiation detector.

16. A laser diode pump wavelength sensing and control method for a laser in accordance with claim 11 including generating a signal in said detector bias and signal measurement circuit to vary the electric power applied to said diode power supply to change the diode output wavelength.

17. A laser diode pump wavelength sensing and control method for a laser in accordance with claim 11 including generating a signal in said detector bias and signal measurement circuit to vary the temperature of said laser diode to thereby change the laser diode output wavelength.

18. A laser diode pump wavelength sensing and control method for a laser in accordance with claim 11 including selecting a laser having an Nd:YAG laser medium.

19. A laser diode pump wavelength sensing and control method for a laser in accordance with claim 11 including selecting a laser having a pulse pumped AlGaAs laser diode array.

* * * * *